(12) United States Patent
Hsieh et al.

(10) Patent No.: US 7,661,305 B2
(45) Date of Patent: Feb. 16, 2010

(54) AIRFLOW DETECTION APPARATUS

(75) Inventors: Ming-Chih Hsieh, Taipei Hsien (TW); Yang-Yuan Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 256 days.

(21) Appl. No.: 11/947,778

(22) Filed: Nov. 30, 2007

(65) Prior Publication Data

US 2009/0095067 A1    Apr. 16, 2009

(30) Foreign Application Priority Data

Oct. 11, 2007   (CN) .................... 2007 1 0202000

(51) Int. Cl.
*G01F 3/08* (2006.01)
*H02P 29/04* (2006.01)

(52) U.S. Cl. ..................... 73/253; 318/268
(58) Field of Classification Search ............ 73/253; 318/268

See application file for complete search history.

(56) References Cited

U.S. PATENT DOCUMENTS

| 5,289,089 | A | * | 2/1994 | Aoki ............... 318/400.26 |
| 5,877,415 | A |   | 3/1999 | Kruse |
| 2002/0190676 | A1 | * | 12/2002 | Horng et al. ............ 318/268 |

* cited by examiner

*Primary Examiner*—Jewel Thompson
(74) *Attorney, Agent, or Firm*—Frank R. Niranjan

(57) ABSTRACT

An airflow detection apparatus configured to detect airflow of a fan includes a first transistor, an amplifier, an A/D converter, a microprocessor, an indicating circuit, and a stabilizing circuit configured for supplying a stable current to the first transistor. The base and the collector of the first transistor are connected to a power supply. The emitter of the first transistor is connected to the amplifier and the stabilizing circuit. The amplifier receives a voltage signal from between the base and the emitter of the first transistor. The voltage signal is converted into a digital signal by the A/D converter. The microprocessor processes the digital signal and output an indicating signal to the indicating circuit to indicate airflow status of the fan.

10 Claims, 1 Drawing Sheet

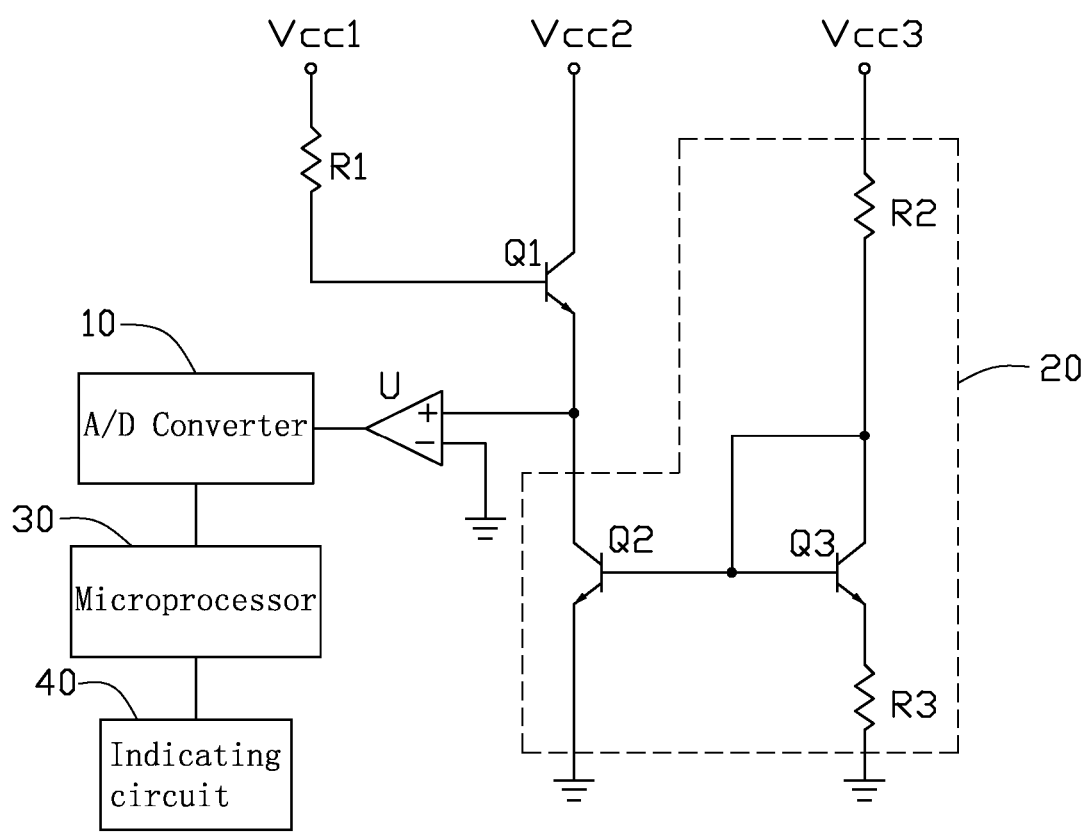

AIRFLOW DETECTION APPARATUS

BACKGROUND

1. Field of the Invention

The present invention relates to an airflow detection apparatus.

2. Description of Related Art

The airflow detection apparatus is essential in many applications. High power-density electronics are liable to overheat and self-destruct when cooling-fan failures go unnoticed. Therefore, it becomes necessary to use some reliable means for airflow detection.

Usually, either a mechanical pressure-actuated vane switch or one of the various types of heat-transfer-based airflow sensors is employed. The mechanical pressure-actuated vane switches are inexpensive, but have low sensitivity. The heat-transfer-based airflow sensors have high sensitivity, but are expensive.

What is needed, therefore, is an airflow detection apparatus which can solve the above the problems.

SUMMARY

An exemplary airflow detection apparatus configured to detect airflow of a fan includes a first transistor, an amplifier, an A/D converter, a microprocessor, an indicating circuit, and a stabilizing circuit configured for supplying a stable current to the first transistor. The base and the collector of the first transistor are connected to a power supply. The emitter of the first transistor is connected to the amplifier and the stabilizing circuit. The amplifier receives a voltage signal from between the base and the emitter of the first transistor. The voltage signal is converted into a digital signal by the A/D converter. The microprocessor processes the digital signal and outputs an indicating signal to the indicating circuit to indicate airflow status of the fan.

Other advantages and novel features will become more apparent from the following detailed description when taken in conjunction with the accompanying drawing, in which:

BRIEF DESCRIPTION OF THE DRAWINGS

The drawing is a circuit diagram of one embodiment of an airflow detection apparatus in accordance with the present invention.

DETAILED DESCRIPTION

Referring to the drawing, an airflow detection apparatus in accordance with an embodiment of the present invention is provided to detect the airflow of a fan which is in a computer system. The airflow detection apparatus includes a first transistor Q1, an amplifier U, an analog/digital (A/D) converter 10, a stabilizing circuit 20, a microprocessor 30, and an indicating circuit 40. The first transistor Q1 is an NPN-type transistor.

The base of the first transistor Q1 is connected to a power supply Vcc1 via a first resistor R1. The collector of the first transistor Q1 is connected to a power supply Vcc2. The emitter of the first transistor Q1 is connected to the positive input end of the amplifier U, and an output end of the stabilizing circuit 20. The negative input end of the amplifier U is grounded. The output end of the amplifier U is connected to an input end of the microprocessor 30 via the A/D converter 10. An output end of microprocessor 30 is connected to the indicating circuit 40. The indicating circuit 40 is used to show users the fan's airflow status. It includes a monitor, a buzzer, or an indicator light.

The stabilizing circuit 20 includes a second transistor Q2 and a third transistor Q3. The second transistor Q2 and the third transistor Q3 are both NPN-type transistors. The collector of the second transistor Q2 acts as the output end of the stabilizing circuit 20, which is connected to the emitter of the first transistor Q1. The emitter of the second transistor Q2 is grounded. The base of the second transistor Q2 is connected to the base of the third transistor Q3. The emitter of the third transistor Q3 is grounded via a third resistor R3. The collector of the third transistor Q3 is directly connected to the base of third transistor Q3. The collector of the third transistor Q3 is also connected to a power supply Vcc3 via a second resistor R2.

In this embodiment, advantage is taken of the temperature characteristic of a transistor. According to such characteristic, when the transistor has a stable incoming current, the voltage Vbe between the base and the emitter of the transistor will change as ambient temperature changes. When the temperature rises, the voltage Vbe declines.

The stabilizing circuit 20 is used to supply a stable current to the first transistor Q1. The stabilizing circuit 20 can be replaced by other components, such as an adjustable precision shunt regulator chip model APL431. An output end of the chip is connected to the emitter of the first transistor Q1. An input end of the chip is connected to the power supply Vcc3.

The first transistor Q1 is located adjacent an air outlet of the fan. When the fan works normally, the airflow of the fan strikes the first transistor Q1. The airflow takes away the heat of the first transistor Q1 so that the temperature declines. As a result, the voltage Vbe between the base and the emitter of the first transistor Q1 rises. When the fan is not working, or its airflow is weak, the temperature of the first transistor Q1 rises. As a result, the voltage Vbe declines accordingly. The voltage signal of the voltage Vbe is amplified by the amplifier U. The amplified voltage signal is transmitted to the A/D converter 10. The A/D converter 10 converts the amplified voltage signal to a digital signal that is readable by the microprocessor 30. The microprocessor 30 processes the digital signal and outputs an indicating signal to the indicating circuit 40 to indicate the airflow status of the fan.

In this embodiment, the stabilizing circuit 20 is located far away from the fan, and in a heat-insulated case. Thus the stabilizing circuit 20 will not be influenced by other components in the computer system.

The airflow detection apparatus has high-sensitivity and low cost.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternately embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An airflow detection apparatus configured to detect airflow of a fan, the airflow detection apparatus comprising:
   a first transistor located adjacent an air outlet of the fan, the base and the collector of the first transistor connected to a power supply to receive power;
   a stabilizing circuit connected to the emitter of the first transistor to supply the first transistor a stable current;
   an amplifier, an input end of the amplifier connected to the emitter of the first transistor to receive a voltage signal from between the base and the emitter of the first transistor, the voltage signal variable with changes in the temperature of the first transistor, an output end of the amplifier outputting an amplified voltage signal;
   an A/D converter, an input end of the A/D converter connected to the output end of the amplifier to receive the amplified voltage signal, and converting the amplified voltage signal to a digital signal;
   a microprocessor connected to an output end of the A/D converter to receive and process the digital signal to an indicating signal; and
   an indicating circuit connected to the microprocessor to receive the indicating signal, and show airflow status of the fan according to the indicating signal.

2. The airflow detection apparatus as claimed in claim 1, wherein the base of the first transistor is connected to the power supply via a first resistor.

3. The airflow detection apparatus as claimed in claim 1, wherein the stabilizing circuit includes a second transistor and a third transistor, the emitter of the second transistor is grounded, the collector of the second transistor is connected to the emitter of the first transistor, the base of the second transistor is connected to the base of the third transistor, the collector of the third transistor is directly connected to the base of the third transistor, the collector of the third transistor is connected to a power supply via a second resistor, the emitter of the third transistor is grounded via a third resistor.

4. The airflow detection apparatus as claimed in claim 3, wherein the first transistor, the second transistor, and the third transistor are all NPN-type transistors.

5. The airflow detection apparatus as claimed in claim 1, wherein the stabilizing circuit is located far away from the air outlet of the fan. .

6. An airflow detection apparatus for detecting airflow status of a fan, comprising:
   a first transistor, the base and the collector of the first transistor provided with fixed voltage, the first transistor located at the airflow direction of the fan, when airflow of the fan cools down the first transistor, the voltage difference between the base and the emitter is changed so that the emitter voltage is changed;
   a stabilizing circuit connected to the emitter of the first transistor to provide a stable current to the emitter;
   an amplifier comprising an input terminal connected to the emitter of the first transistor to amplify the emitter voltage to an amplified voltage signal; and
   a processing unit processing the amplified voltage signal, and transmitting the processed signal to an indicating circuit to indicate the airflow status of the fan.

7. The airflow detection apparatus as claimed in claim 6, wherein the stabilizing circuit is in a heat-insulated case 8. The airflow detection apparatus as claimed in claim 7, wherein the input terminal of the amplifier is a positive input terminal, the negative input terminal of the amplifier is grounded.

9. The airflow detection apparatus as claimed in claim 7, wherein the stabilizing circuit includes a second transistor and a third transistor, the emitter of the second transistor is grounded, the collector of the second transistor is connected to the emitter of the first transistor, the base of the second transistor is connected to the base of the third transistor, the collector of the third transistor is directly connected to the base of the third transistor, the collector of the third transistor is connected to a power supply via a second resistor, the emitter of the third transistor is grounded via a third resistor.

10. The airflow detection apparatus as claimed in claim 7, wherein the processing unit includes an A/D convert and a microprocessor, an input terminal of the A/D converter is connected to an output terminal of the amplifier to receive the amplified voltage signal, the A/D convert converts the amplified voltage signal to a digital signal, the microprocessor is connected to an output terminal of the A/D converter to receive and process the digital signal to an indicating signal.

* * * * *